United States Patent [19]

Sahm

[11] 4,068,025
[45] Jan. 10, 1978

[54] METHOD OF APPLYING A PROTECTIVE COATING TO A BODY

[75] Inventor: Peter Sahm, Nussbaumen, Switzerland

[73] Assignee: Brown, Boveri & Company Limited, Baden, Switzerland

[21] Appl. No.: 702,474

[22] Filed: July 6, 1976

Related U.S. Application Data

[62] Division of Ser. No. 235,244, March 16, 1972, Pat. No. 3,978,253.

[30] Foreign Application Priority Data

Mar. 22, 1971   Switzerland ................ 4179/71

[51] Int. Cl.² .................. B05D 3/04; B05D 3/10
[52] U.S. Cl. .................... 427/309; 427/250; 204/32 R; 204/192 C; 428/668; 428/681
[58] Field of Search ........... 427/309, 250; 204/32 R, 204/164, 192; 29/195, 196.6

[56] References Cited

U.S. PATENT DOCUMENTS

| | | | |
|---|---|---|---|
| 1,978,791 | 10/1934 | Hale | 204/32 R |
| 2,504,178 | 4/1950 | Burnban et al. | 204/32 R |
| 2,570,174 | 10/1951 | Weber | 204/32 R |
| 2,574,305 | 11/1951 | Wagner | 204/32 R |
| 2,927,066 | 3/1960 | Shaer | 204/43 R |
| 2,992,984 | 7/1961 | Rummel | 204/164 |
| 3,450,465 | 6/1969 | Prance et al. | 427/354 |
| 3,576,729 | 4/1971 | Sigournay et al. | 204/192 |
| 3,592,706 | 7/1971 | Wagner | 156/17 |
| 3,615,935 | 10/1971 | O'Keeffe et al. | 148/187 |
| 3,650,861 | 3/1972 | Angell | 204/32 R |

Primary Examiner—Ronald H. Smith
Assistant Examiner—Sadie L. Childs
Attorney, Agent, or Firm—Oblon, Fisher, Spivak, McClelland & Maier

[57] ABSTRACT

A protective coating is applied to a eutectic or near-eutectic alloy which contains at least one continuously multi-ply connected crystalline phase and at least one other phase which may be continuous or non-continuous, by removing from the surface of said alloy, one or more of the phases, such that at least one continuous phase will remain unaffected, so as to roughen said alloy surface, and thereafter coatng said surface with a protective coating.

4 Claims, 1 Drawing Figure

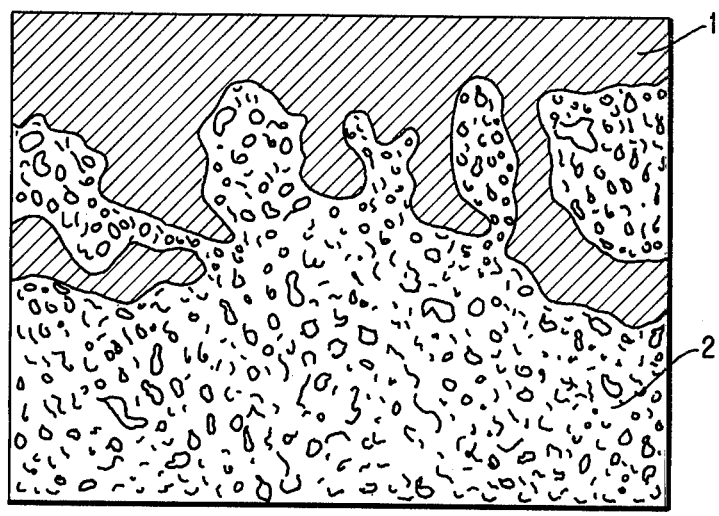

METHOD OF APPLYING A PROTECTIVE COATING TO A BODY

This is a division, of application Ser. No. 235,244, filed Mar. 16, 1972 and now U.S. Pat. No. 3,978,253.

BACKGROUND OF THE INVENTION

1. Field of the Invention

This invention relates generally to a technique for applying a protective coating to a eutectic or near-eutectic alloy, and more particularly to a technique for providing a firmly adherent protective coating to a eutectic or near-eutectic alloy.

2. Description of the Prior Art

It is well known to protect and prolong the useable life of metal bodies by treating their surfaces with one or more protective coatings. In fact, a wide variety of surface coatings and coating techniques have been developed in the prior art for just this purpose, and these have been met with varying degrees of success and acceptability dependent upon the particular metal being treated and the particular coating composition.

In the usual instance, unless the applied coating is quite thin, the coating material must be selected so that its coefficient of thermal expansion matches identically or nearly identically with that on the metal being protected. If the coating is too thick and if the coefficients differ by too great an extent, poor adhesion and peeling of the coating can occur, which problem becomes even more severe if the surface is subjected to frequent, or even occasional, thermal shocks. When the metal being protected is an alloy, such as a eutectic alloy, containing multiple crystalline phases, each phase will often have a somewhat different coefficient of thermal expansion. Therefore, it can become quite a difficult matter to identically, or even closely, match the thermal expansion coefficients, so that in such alloys coating adhesion has been an especially acute problem.

Another difficulty with the multiple phase eutectic alloys is that wear and corrosion can occur, not only on the top surface, but also within the upper stratum of the alloy, at the grain boundaries, or in those crystalline phases which have low resistance characteristics. With these types of alloys, merely applying a coating to the alloy surface may not provide sufficient protection for both the surface and the sub-surface from corrosion and wear.

SUMMARY OF THE INVENTION

Accordingly, it is one object of this invention to provide a technique for applying an adherent protective coating to a eutectic or near eutectic alloy.

It is another object of this invention to provide a technique for protecting the surface and sub-surface of a eutectic or near eutectic alloy.

Still another object of this invention is to provide a technique for applying an adherent protective coating to a eutectic or near eutectic alloy of the type having multiple crystalline phases, wherein the difficulties in attempting to match the coefficients of coating material with that of each crystalline phase in the alloy, are avoided.

These and other objects, as will hereinafter become more readily apparent, have been attained by removing at least one crystalline phase from a eutectic or near eutectic alloy containing two or more crystalline phases, at least one of which is continuously multiply connected within the alloy structure, so as to roughen said surface, and thereafter applying a protective coating to said roughened surface.

BRIEF DESCRIPTION OF THE DRAWING

FIG. 1 is a representation of a cross-section of a eutectic or near eutectic alloy provided with a protective coating in accordance with the methods of this invention.

DETAILED DESCRIPTION OF PREFERRED EMBODIMENTS

According to this invention, a eutectic or near eutectic alloy characterized by two or more crystalline phases, at least one of which is continuously multiply connected within the alloy structure, is treated so as to remove at least one of said phases from the surface of the alloy such that at least one continuous phase will remain unaffected, so as to roughen the alloy surface. Alloys containing multiple crystalline phases include ternary or polynary phase alloys. Particularly suitable eutectic or near eutectic alloys which are treatable by the methods of this invention are those having the composition $Me_{1-y}Cr_y$—$Cr_{7-x}Me_xC_3$, wherein Me may be cobalt, nickel, iron or combinations thereof, and y ranges from 0.20 to 0.40 and x ranges from 0.4 to 1.6 when Me is Co.

Removal of one of the crystalline phases may be effected by chemical means, electrolytic means, thermal means or mechanical means. In other words, the said phase may be removed from the surface by chemical or electrolytic etching, by heat treatment, or by mechanical scraping or the like. The particular method of removing the said crystalline phase is not critical, and the particular techniques for accomplishing this result are well known in the art. The etching effect may extend from $25\mu$ to $100\mu$ into the surface. Particularly good results are obtained by the use of electrolytic etching. In this technique, the alloy being treated may be connected as a cathode and subjected to an applied potential in an acid bath for a suitable time period to selectively dissolve out one of the crystalline phases from the surface.

Another good technique for use with an alloy containing a carbide crystalline phase, such as Co-Cr-C alloys, is to dissolve the carbide phase in a light oil waste gas at a temperature of between 700° and 1,000° C. over a period of 100 to 1,000 hours, the speed of flow of the light oil waste gas being between 50 and 100 m/sec.

The protective coating may then be applied by conventional techniques such as chemical vapor deposition, electrodeposition, spraying, diffusion of a powder slurry, diffusion controlled aluminizing, inchromizing, chromalizing or the like. For example, a pure Si-coating may be applied by chemical vapor deposition, pure Cr-coatings or suitable layers of Fe, Cr, etc. may be applied galvanically and aluminum enrichment of the surface may be obtained by normal $Al$-$Al_2O_3$ packing.

Alloys containing 59 – 70% cobalt, 30 – 50% chromium, and 2 – 4% carbon have been successfully coated by removing the matrix from the upper surface electrolytically.

As can be appreciated by the above disclosure, the removal of at least one of the crystalline phases of the alloy from the surface permits the formation of an interlocking effect between the coating and the remaining phases on the surface, thereby alleviating thermal expansion coefficient difficulties.

Having now generally described the invention, a further understanding can be obtained by reference to certain specific Examples which are provided herein for purposes of illustration only and are not intended to be limiting unless otherwise so specified.

EXAMPLE 1

A body made of an alloy containing 56.9% cobalt, 40.7% Cr, and 2.4% C was roughened on its surface by selectively dissolving out the carbide crystals. This was done in light oil waste gas at a temperature of 850° C. over a period of 300 hours, the speed of flow of the light oil waste gas amounting to 100 metres per second at a pressure of 1.4 atm. Small amounts of S, Na and V were contained in the fuel. The surface was then subjected to ultrasonic cleaning to remove loosely adhering particles. The clean surface was chromiumplated by electrodeposition.

As can be seen from FIG. 1, substantial keying of the protective coating 1 to the roughened surface of the body 2 was achieved.

EXAMPLE 2

A body composed of an alloy containing 56.9% cobalt, 40.7% chromium, and 2.4% carbon was roughened on its surface by selectively dissolving out the matrix phase. For this purpose the body was connected as cathode to a voltage of 5 volts in 5% hydrochloric acid for 10 minutes with a current density of 8.5 amps per square centimetre. The roughened surface was freed from loosely adhering particles by ultrasonic treatment. A coating of silicon was applied by electrodeposition to the cleaned surface and likewise exhibited firm keying to the roughened surface.

Having now fully described the invention, it will be apparent to one of ordinary skill in the art that many changes and modifications can be made thereto, without departing from the spirit or scope of the invention.

Accordingly, What is claimed as new and intended to be covered by letters patent is:

1. A method of applying a protective coating to a eutectic or near eutectic alloy which contains a continuously multi-ply connected crystalline phase, and at least one other non-continuous phase, which comprises completely removing from the surface of said alloy, one or more of said non-continuous phases such that a roughened alloy surface, having the continuous phase remain and thereafter coating said roughened surface, wherein the crystalline phase is a carbide phase, characterized in that the carbide is removed by a light oil water gas at 700° – 100° C, over a period of 100 – 1000 hours, the speed of flow of the light oil waste gas being 50 – 100 meters per second.

2. The method of claim 1, wherein the protective coating is applied by chemical vapor deposition.

3. A method of applying a protective coating to a eutectic or near eutectic alloy which contains a continuously multi-ply connected crystalline phase, and at least one other non-continuous phase, which comprises electrolytically etching said alloy by connecting said alloy as a cathode and subjecting said cathode to a voltage potential in an acid bath to completely remove from the surface of said alloy, one or more of said non-continuous phases such that a roughened alloy surface, having the continuous phase remain and thereafter coating said roughened surface, wherein the protective coating is applied by electrodeposition.

4. The method of claim 3, wherein said electrolytic etching is conducted at a voltage of 5 volts in 5% hydrochloric acid for 10 minutes with a current density of 8.5 amperes per square centimeter.

* * * * *